(12) United States Patent
Soma (10) Patent No.: US 11,165,512 B2
(45) Date of Patent: Nov. 2, 2021

(54) WIRELESS COMMUNICATION IDENTIFICATION DEVICE AND WIRELESS COMMUNICATION IDENTIFICATION METHOD

(71) Applicant: NEC Corporation, Tokyo (JP)

(72) Inventor: Tatsuya Soma, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 17/056,678

(22) PCT Filed: May 20, 2019

(86) PCT No.: PCT/JP2019/019891
§ 371 (c)(1),
(2) Date: Nov. 18, 2020

(87) PCT Pub. No.: WO2019/225539
PCT Pub. Date: Nov. 28, 2019

(65) Prior Publication Data
US 2021/0167869 A1    Jun. 3, 2021

(30) Foreign Application Priority Data

May 23, 2018  (JP) .............................. JP2018-099178

(51) Int. Cl.
*H04B 17/00*  (2015.01)
*H04B 17/10*  (2015.01)
(52) U.S. Cl.
CPC ......... *H04B 17/102* (2015.01); *H04B 17/104* (2015.01)

(58) Field of Classification Search
CPC ..... H04B 17/102; H04B 17/104; H04B 17/00
(Continued)

(56) References Cited

U.S. PATENT DOCUMENTS 6,509,728 B1 * 1/2003 Uchino ................. G01R 23/16
324/76.13
6,539,351 B1 * 3/2003 Chen .................... G06K 9/6226
704/236

(Continued)

FOREIGN PATENT DOCUMENTS

EP    2637029 A1    9/2013
JP    3-194482 A    8/1991
(Continued)

OTHER PUBLICATIONS

International Search Report corresponding to PCT/JP2019/019891, dated Jul. 9, 2019 (4 pages).

*Primary Examiner* — Hai V Nguyen (57) ABSTRACT

A wireless communication identification device includes a sensor unit configured to receive wireless signals from a plurality of wireless communication devices at a plurality of positions and to thereby detect the radio-waveform feature quantity and the radio-field intensity; a storage unit configured to store the radio-waveform feature quantity and the radio-field intensity as the history information; and a clustering part configured to apply a likelihood function including a correlation coefficient of the time-series radio-waveform feature quantity of wireless signals received at a plurality of positions to the history information and to thereby carry out clustering of the radio-waveform feature quantity for each wireless communication device serving as a transmission source of wireless signals.

9 Claims, 5 Drawing Sheets

(58) Field of Classification Search
USPC .............................................. 455/67.11, 63.1
See application file for complete search history.

(56) References Cited

U.S. PATENT DOCUMENTS

| | | | | |
|---|---|---|---|---|
| 6,643,337 B1* | 11/2003 | Pierce | ..................... | G01S 7/024 |
| | | | | 342/189 |
| 6,829,384 B2* | 12/2004 | Schneiderman | ..... | G06K 9/3241 |
| | | | | 375/240.19 |
| 6,944,139 B1* | 9/2005 | Campanella | ....... | H04B 7/18523 |
| | | | | 370/315 |
| 7,177,341 B2* | 2/2007 | McCorkle | ................ | H04B 1/69 |
| | | | | 375/130 |
| 7,864,967 B2* | 1/2011 | Takeuchi | .................. | H04S 7/30 |
| | | | | 381/56 |
| 8,145,215 B2* | 3/2012 | Olson | ............... | H04W 36/0088 |
| | | | | 455/434 |
| 8,391,914 B2* | 3/2013 | Furuya | ................... | H04H 20/93 |
| | | | | 455/550.1 |
| 8,456,363 B2* | 6/2013 | Konishi | ................ | G01S 5/0252 |
| | | | | 342/451 |
| 8,768,260 B2* | 7/2014 | Tsukamoto | .......... | H04B 17/327 |
| | | | | 455/67.11 |
| 8,831,526 B2* | 9/2014 | Hasegawa | ............. | H04L 1/0015 |
| | | | | 455/67.11 |
| 8,930,146 B2* | 1/2015 | Katsukura | .......... | G08B 21/0423 |
| | | | | 702/19 |
| 9,214,971 B2* | 12/2015 | Choi | ................. | H04B 1/1027 |
| 9,274,542 B2* | 3/2016 | Marr | .................. | G06F 1/0321 |
| 9,546,797 B2* | 1/2017 | Kuroiwa | ................ | F24F 11/30 |
| 9,930,680 B2* | 3/2018 | Takagi | ................ | H04W 72/082 |
| 9,953,267 B2* | 4/2018 | Maruyama | .............. | G06N 5/048 |
| 9,980,042 B1* | 5/2018 | Benattar | .............. | H04R 25/407 |
| 10,037,695 B2* | 7/2018 | D'Amato | ............. | G08G 1/096775 |
| 10,198,630 B2* | 2/2019 | Noda | .................. | G06K 9/0053 |
| 10,359,502 B2* | 7/2019 | Kitsunezuka | .......... | H04H 60/50 |
| 10,728,705 B2* | 7/2020 | Tsukamoto | ........ | H04B 17/3911 |
| 10,977,520 B2* | 4/2021 | Turkelson | ........... | G06K 9/00751 |
| 2002/0042793 A1* | 4/2002 | Choi | ..................... | G06F 16/335 |
| 2002/0064245 A1* | 5/2002 | McCorkle | ........... | H04L 27/0004 |
| | | | | 375/346 |
| 2006/0084388 A1* | 4/2006 | Li | ........................ | H04W 52/54 |
| | | | | 455/67.11 |
| 2007/0185656 A1* | 8/2007 | Schadt | ............... | G01N 33/6803 |
| | | | | 702/19 |
| 2009/0143019 A1* | 6/2009 | Shellhammer | ....... | H04B 17/327 |
| | | | | 455/67.11 |
| 2009/0170501 A1* | 7/2009 | Olson | ............... | H04W 36/0088 |
| | | | | 455/425 |
| 2010/0009636 A1* | 1/2010 | Hasegawa | ............. | H04L 1/0015 |
| | | | | 455/67.11 |
| 2010/0075704 A1* | 3/2010 | McHenry | ............... | H04B 7/022 |
| | | | | 455/509 |
| 2010/0158261 A1* | 6/2010 | Takeuchi | ................ | G10L 21/02 |
| | | | | 381/56 |
| 2010/0184384 A1* | 7/2010 | Jones | .................... | H04B 17/318 |
| | | | | 455/67.11 |
| 2010/0233963 A1* | 9/2010 | Harada | ................. | H04W 16/14 |
| | | | | 455/63.3 |
| 2011/0060708 A1* | 3/2011 | Suzuki | .................. | G06N 20/00 |
| | | | | 706/12 |
| 2012/0021710 A1* | 1/2012 | Tsukamoto | .......... | H04B 17/327 |
| | | | | 455/226.1 |
| 2012/0094618 A1* | 4/2012 | Harada | ............... | H04L 27/0006 |
| | | | | 455/84 |
| 2013/0238265 A1 | 9/2013 | Gudan et al. | | |
| 2015/0147985 A1* | 5/2015 | Marr | ..................... | G06F 1/0321 |
| | | | | 455/91 |
| 2016/0117921 A1* | 4/2016 | D'Amato | ......... | G08G 1/096741 |
| | | | | 701/117 |
| 2016/0224830 A1* | 8/2016 | Noda | .................. | G01N 30/8634 |
| 2017/0220752 A1* | 8/2017 | Murphy | ................. | G06N 5/048 |
| 2018/0011164 A1* | 1/2018 | Kitsunezuka | ........ | H04B 17/318 |
| 2018/0165554 A1* | 6/2018 | Zhang | .................. | G06K 9/6256 |
| 2018/0220305 A1* | 8/2018 | Lei | ....................... | H04W 72/005 |
| 2019/0012604 A1* | 1/2019 | Hiratsuka | ............... | G06N 20/00 |
| 2019/0166461 A1* | 5/2019 | Tsukamoto | ............ | G01R 29/08 |
| 2020/0013511 A1* | 1/2020 | de Zambotti | ............ | G06N 5/02 |
| 2020/0210768 A1* | 7/2020 | Turkelson | .......... | G06K 9/00751 |
| 2020/0300972 A1* | 9/2020 | Wang | ........................ | A61B 5/7207 |
| 2020/0366319 A1* | 11/2020 | Shiraishi | .......... | G11B 20/10055 |
| 2020/0406860 A1* | 12/2020 | Mai | ......................... | B60R 25/31 |
| 2021/0096531 A1* | 4/2021 | Kurosumi | .......... | G05B 23/0221 |
| 2021/0136515 A1* | 5/2021 | Zhang | .................. | H04W 4/023 |
| 2021/0173045 A1* | 6/2021 | Hu | ........................ | G08B 21/043 |
| 2021/0173046 A1* | 6/2021 | Regani | ..................... | G01S 7/415 |

FOREIGN PATENT DOCUMENTS

| | | |
|---|---|---|
| JP | 08-278337 A | 10/1996 |
| JP | 2003-044789 A | 2/2003 |
| JP | 2006-3314 A | 1/2006 |
| JP | 2007-206037 A | 8/2007 |
| JP | 2012-47724 A | 3/2012 |
| JP | 2013-186125 A | 9/2013 |

* cited by examiner

WIRELESS COMMUNICATION IDENTIFICATION DEVICE AND WIRELESS COMMUNICATION IDENTIFICATION METHOD

This application is a national stage application of International Application No. PCT/JP2019/019891 entitled, "WIRELESS COMMUNICATION IDENTIFICATION DEVICE AND WIRELESS COMMUNICATION IDENTIFICATION METHOD," filed on May 20, 2019, which claims priority to Japanese Patent Application No. 2018-099178, filed on May 23, 2018. The entire contents of these applications are incorporated herein by reference in their entirety. Embodiments of the present invention relate to a wireless communication identification device and a wireless communication identification method which can identify a plurality of wireless communication devices.

TECHNICAL FIELD

The present invention relates to a wireless communication identification device and a wireless communication identification method which can identify a plurality of wireless communication devices.

BACKGROUND ART

It is necessary to identify wireless signals of wireless communication devices under the environment in which a plurality of wireless communication devices may transmit or receive wireless signals therebetween. Patent Document 1 discloses a radio-wave identification device and a radio-wave identification method which are designed to accurately identify radio waves under the environment causing mixed emissions of radio waves. The radio-wave identification device is designed to identify radio waves according to their feature quantity by sorting waveforms of radio waves received from wireless communication devices according to similarity of feature quantity. Specifically, the radio-wave identification device may calculate feature quantity of received signals for each predetermined time so as to store the feature quantity in association with waveform samples of received signals, wherein the radio-wave identification device may calculate a similarity of feature quantity with respect to each combination of two waveform samples so as to select a combination of two waveform samples having the smallest similarity of feature quantity. Subsequently, the radio-wave identification device may carry out sorting (or clustering) of multiple waveform samples upon determining which waveform sample between two waveform samples may have a higher similarity with respect to each waveform sample among a plurality of waveform samples.

CITATION LIST

Patent Literature Document

Patent Document 1: Japanese Patent Application Publication No. 2012-47724

SUMMARY OF INVENTION

Technical Problem

In the aforementioned technology, it is preferable to identify radio waves with high accuracy. However, the radio-wave identification device may carry out clustering of wireless signals according to similarity of feature quantity in wireless signals, however, it is difficult to achieve highly-accurate clustering of wireless signals under the condition having radio waves changed in received-signal strength every moment due to movement of wireless communication devices. To improve clustering accuracy of multiple wireless signals, for example, it is possible to expect clustering reflecting not only feature quantity of wireless signals but also reception places or reception times to receive wireless signals.

The present invention is made to solve the aforementioned problem and aims to provide a wireless communication identification device and a wireless communication identification method which can identify a plurality of wireless communication devices with high accuracy.

Solution to Problem

A first aspect of the present invention is directed to a wireless communication identification device including a sensor unit configured to receive wireless signals from a plurality of wireless communication devices at a plurality of positions and to thereby detect the radio-waveform feature quantity and the radio-field intensity, a storage unit configured to store the radio-waveform feature quantity and the radio-field intensity as the history information, and a clustering part configured to apply a likelihood function including a correlation coefficient of the time-series radio-waveform feature quantity of wireless signals received at a plurality of positions to the history information and to thereby carry out clustering of the radio-waveform feature quantity for each wireless communication device serving as a transmission source of wireless signals.

A second aspect of the present invention is directed to a wireless communication identification method including a process configured to receive wireless signals from a plurality of wireless communication devices at a plurality of positions and to thereby detect the radio-waveform feature quantity and the radio-field intensity, a process configured to store the radio-waveform feature quantity and the radio-field intensity as the history information, and a process configured to apply a likelihood function including a correlation coefficient of the time-series radio-waveform feature quantity of wireless signals received at a plurality of positions to the history information and to thereby carry out clustering of the radio-waveform feature quantity for each wireless communication device serving as a transmission source of wireless signals.

A third aspect of the present invention is directed to a storage medium configured to store a program causing a computer to implement a process configured to receive wireless signals from a plurality of wireless communication devices at a plurality of positions and to thereby detect the radio-waveform feature quantity and the radio-field intensity, a process configured to store the radio-waveform feature quantity and the radio-field intensity as history information, and a process configured to apply a likelihood function including a correlation coefficient of the time-series radio-waveform feature quantity of wireless signals received at a plurality of positions to the history information and to thereby carry out clustering of the radio-waveform feature quantity for each wireless communication device serving as a transmission source of wireless signals.

Advantageous Effects of Invention

Upon receiving wireless signals from multiple wireless communication devices, the present invention is designed to form clustering of waveform signals in consideration of reception places or reception times in addition to radio-field intensity and radio-waveform-feature quantity, thus identifying wireless communication devices serving as sources of originating radio waves with high accuracy.

DESCRIPTION OF EXEMPLARY EMBODIMENTS

A wireless communication identification device and a wireless communication identification method according to the present invention will be described in detail with reference to the accompanying drawings. In multiple drawings, same configuration parts or same functional parts will be denoted by same reference signs; hence, their descriptions will be appropriately omitted here.

First Exemplary Embodiment

Figure 1:
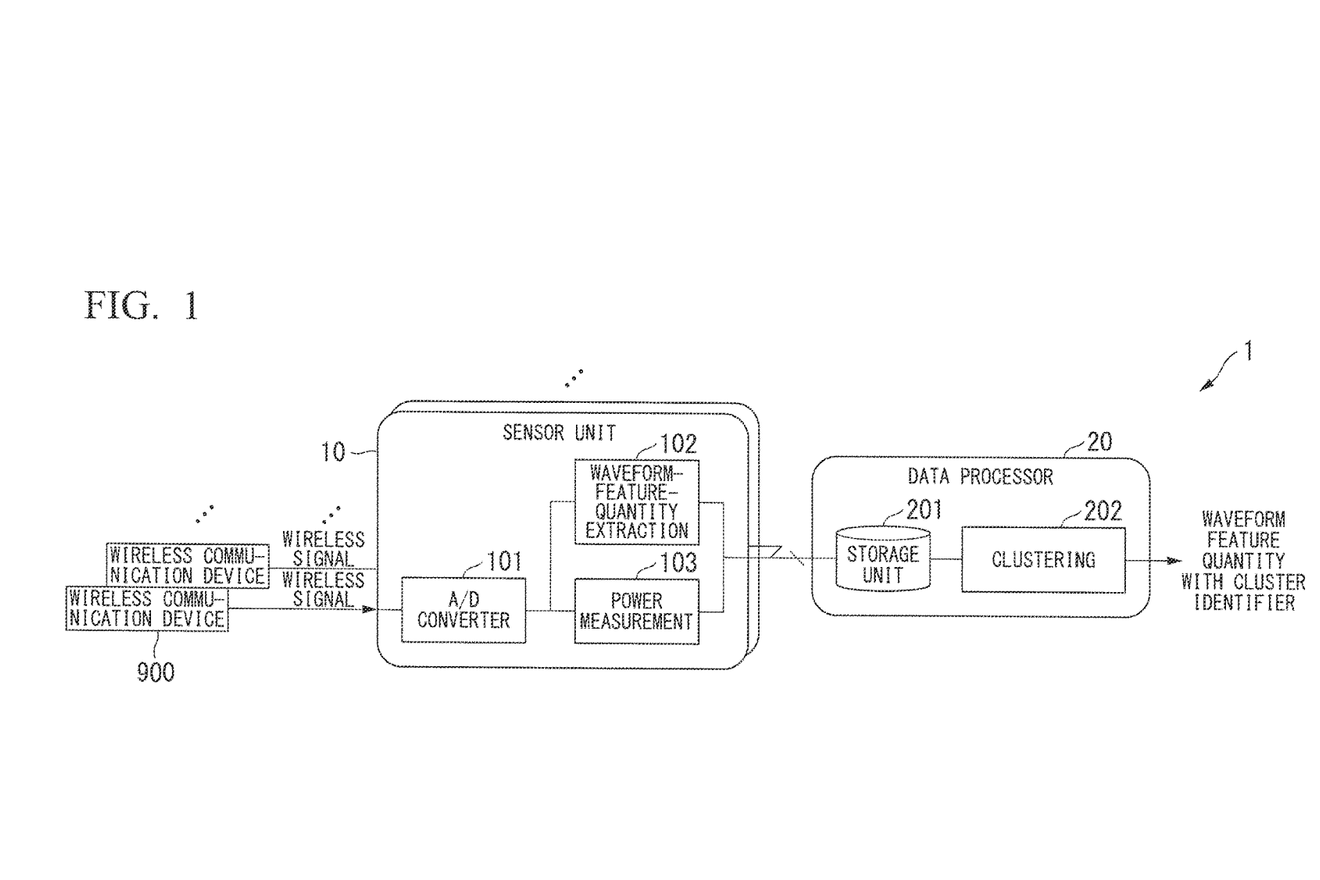
FIG. 1 is a block diagram showing a configuration example of a wireless communication identification device according to the first exemplary embodiment of the present invention.

FIG. 1 is a block diagram showing a configuration example of a wireless communication identification device 1 according to the first exemplary embodiment of the present invention. The wireless communication identification device 1 includes a plurality of sensor units 10 and a data processor 20. The sensor unit 10 includes an analog/digital (A/D) converter 101, a waveform-feature-quantity extraction part 102, and a power measurement part 103. The data processor 20 includes a storage unit 201 and a clustering part 202.

A plurality of sensor units 10 are configured to receive wireless signals from a plurality of wireless communication devices 900 at different positions, thus sensing waveform feature quantity and radio-field intensity (or received-signal strength) of wireless signals. Therefore, a plurality of sensor units 10 in its entirety may receive a plurality of wireless signals at multiple points so as to sense waveform feature quantity and radio-field intensity of wireless signals. Specifically, the sensor unit 10 is configured to receive wireless signals, which are input to the A/D converter 102 as analog signals. The A/D converter 101 is configured to convert analog signals into digital signals, which are delivered to the waveform-feature-quantity extraction part 102 and the power measurement part 103. The waveform-feature-quantity extraction part 102 is configured to extract waveform feature quantity from digital signals while the power measurement part 103 is configured to calculate radio-field intensity of received radio waves from digital signals. Accordingly, the sensor unit 10 may send to the data processor 20 the information relating to a reception position and a reception time to receive wireless signals in addition to the waveform feature quantity extracted from wireless signals and the radio-field intensity calculated from wireless signals. In this connection, the waveform feature quantity and the radio-field intensity of wireless signals as well as the reception position and the reception time to receive wireless signals, which are output from the sensor unit 10, will be collectively referred to as "wireless signal information".

The data processor 20 inputs the wireless signal information from a plurality of sensor units 10 so as to store the wireless signal information on a storage unit 201. The storage unit 201 is configured to store the waveform feature quantity and the radio-field intensity of wireless signals as well as the reception position and the reception time to receive wireless signals as the history information. When the storage unit 201 has accumulated a certain amount of wireless signal information, the wireless signal information will be sent to the clustering part 202. The clustering part 202 is configured to carry out clustering with respect to a plurality of wireless signal information for each wireless communication device 900 serving as a transmission source of wireless signals, thus outputting the waveform feature quantity for each cluster together with its cluster identifier. In this connection, the wireless communication identification device 1 is configured to handle various types of wireless communication devices 900 which can be identified based on the waveform feature quantity of wireless signals. As the wireless communication device 900, for example, it is possible to adopt a mobile communication device such as a mobile terminal device.

Figure 2:
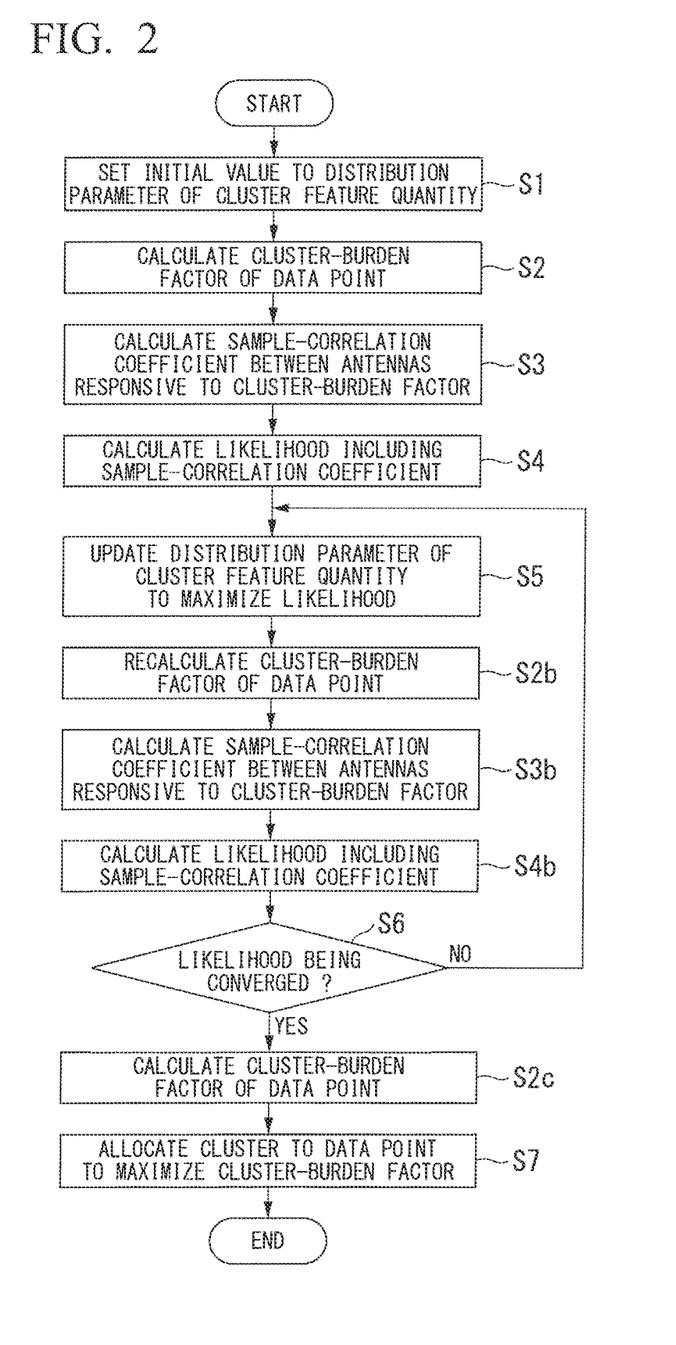
FIG. 2 is a flowchart showing an example of a clustering process of wireless communication devices with the wireless communication identification device according to the first exemplary embodiment of the present invention.

Next, the operation of the clustering part 202 of the data processor 20 included in the wireless communication identification device 1 will be described below. FIG. 2 is a flowchart showing an example of a clustering process implemented by the clustering part 202 (steps S1 through S7). The clustering part 202 is configured to carry out clustering of radio feature quantity (or waveform feature quantity) for each wireless communication device 900 serving as a transmission source of wireless signals according to the clustering process shown in FIG. 2.

The following descriptions refer to a cluster count which was known in advance. Even when a cluster count is unknown, it is possible to assume various cluster counts and to thereby select a cluster count having the highest likelihood upon carrying out a clustering process using each cluster count. In addition, it is assumed that the feature-quantity distribution of wireless signals may be subjected to the mixed Gaussian distribution. The mixed Gaussian distribution is given by Equation (1).

[Equation 1]

$$p(x) = \sum_{k=1}^{K} \pi_k N(x \mid \mu_k, \Sigma_k) \quad (1)$$

In Equation (1), "p(x)" indicates probability, and "x" is a variable indicating data subjected to the mixed Gaussian distribution. In the present exemplary embodiment, the feature quantity of wireless signals is input to "x". In addition, "K" indicates a cluster count; "N" indicates the Gaussian distribution; and "$\mu_k$" indicates an average value of Gaussian distribution. Moreover, "$\Sigma_k$" indicates a variance of Gaussian distribution, and "$\pi_k$" indicates a mixing coefficient of Gaussian distribution.

For example, it is assumed that clustering be carried out in units each corresponding to a combination of radio-field intensity $y_{n,p}$ and radio feature quantity (or waveform feature quantity) $x_{n,p}$ obtained from a single wireless signal received by the sensor unit 10 at position p at nth-time. In this connection, a set of combinations of radio feature quantity $x_{n,p}$ and radio-field intensity $y_{n,p}$ will be entirely referred to as X. The clustering part 202 may set $\pi_k$, $\mu_k$, $\Sigma_k$ as initial values of parameters used for the Gaussian function for modeling radio feature quantity of radio waves belonging to each individual cluster according to the clustering process of FIG. 2 (S1).

Using the mixed Gaussian distribution having parameters which are set in step S1, the clustering part 202 may calculate a cluster-burden factor $\gamma_{n,p,k}$ indicating probability that radio feature quantity $x_{n,p}$ obtained at position p at nth-time would belong to kth-cluster according to Equation (2) (S2).

[Equation 2]

$$\gamma_{n,p,k} = \frac{\pi_k N(x_{n,p} \mid \mu_k, \Sigma_k)}{\sum_{j=1}^{K} \pi_j N(x_{n,p} \mid \mu_j, \Sigma_j)} \quad (2)$$

The clustering part 202 may produce pairs of radio feature quantity obtained at different positions $p_l$, $p_m$ in a kth-cluster in a time series of acquisition times to acquire radio feature quantity with respect to data points stochastically sorted according to cluster-burden factors, thus calculating their sample-correlation coefficients $r_k(p_l,p_m)$ according to Equation (3) (S3).

[Equation 3]

$$r_k(p_l, p_m) = \frac{\Sigma_n \gamma_{n,p_l,k} \gamma_{n,p_m,k}(x_{n,p_l} - avx_{p_l})(x_{n,p_m} - avx_{p_m})}{\sqrt{(\Sigma_n \gamma_{n,p_l,k}(x_{n,p_l} - avx_{p_l})^2)(\rho_n \gamma_{n,p_m,k}(x_{n,p_m} - avx_{p_m})^2)}} \quad (3)$$

In Equation (3), "$avx_p$" indicates an average of radio feature quantity $x_{n,p}$ in a direction of time (n). In this connection, it is possible to compensate for data until completion of the information relating to the number of data obtained at radio-acquisition positions or acquisition time to acquire radio feature quantity. The clustering part 202 may add the square of sample-correlation coefficients calculated in step S3 to the log-likelihood function of the mixed Gaussian distribution function which is set in step S1 so as to produce addition results at different acquisition positions in each cluster as the entire likelihood function of Equation (4), thus calculating the likelihood entirely covering data points, i.e. ln $p(X|\mu,\Sigma,\pi)$ (S4).

[Equation 4]

$$\ln p(X \mid \mu, \Sigma, \pi) = \sum_n \ln \left\{ \sum_{k=1}^{K} \sum_p \pi_k N(x_{n,p} \mid \mu_k, \Sigma_k) \right\} + \ln \left\{ \sum_{k=1}^{K} \sum_{p_l \neq p_m} r_k(p_l, p_m)^2 \right\} \quad (4)$$

In Equation (4), ln represents a natural logarithm while X represents the entirety of data points. In addition, $\mu$ represents an average value of the Gaussian distribution; $\Sigma$ represents a variance of the Gaussian distribution; and $\pi$ represents a mixing coefficient of the Gaussian distribution. In this connection, the entire likelihood function is not necessarily limited to Equation (4). For example, it is possible to adopt various types of functions which may include the likelihood of the mixed Gaussian function set in step S1 and the sample-correlation coefficient calculated in step S3, which may be monotonously increased in value with respect to the likelihood of the mixed Gaussian function, and which may produce values which become larger in response to a larger sample-correlation coefficient. In this connection, the likelihood obtained in step S4 will be set to an initial value of likelihood used for determining convergence of the likelihood in step S6.

The clustering part 202 may update parameters of the mixed Gaussian distribution in order to maximize the likelihood function calculated in step S4 (S5). This maximization may carry out clustering to increase an absolute correlation value of time-series radio feature quantity of radio waves which are subjected to clustering with the same terminal but received at different positions. In steps S2b through S4b, the clustering part 202 may recalculate the likelihood using distribution parameters of cluster feature quantity updated in step S5. In this connection, step S2b is identical to step S2; step S3b is identical to step S3; and step S4b is identical to step S4.

The clustering part 202 may determine whether the likelihood will be converged due to distribution parameters of cluster feature quantity updated in step S5 (S6). When the likelihood is converged (S6: YES), the flow proceeds to step S3c. When the likelihood is not converged (S6: NO), the flow returns to step S5.

The clustering part 202 may calculate the cluster-burden factor of a final data point using the mixed Gaussian distribution which is obtained after convergence of the likelihood (S2c). The clustering part 202 may allocate a cluster having the highest probability in the cluster-burden factor obtained in step S2c as a cluster ascribed to data points (S7). Accordingly, the clustering part 202 may complete the clustering process shown in FIG. 2.

As described above, the clustering part 202 is configured to carry out clustering of waveform feature quantity of radio waves for each wireless communication device 900 serving as a transmission source of wireless signals using the history information stored on the storage unit 201. The clustering part 202 is configured to carry out clustering adopting the likelihood function (Equation (4)) including the correlation coefficient $r_k(p_l,p_m)$ of time-series feature quantity of radio waves received at different positions.

As described above, the sensor unit 10 is configured to sense the radio-field intensity and the waveform feature quantity of radio waves upon receiving wireless signals at multiple positions while the storage unit 201 is configured to store the history information relating to the radio-field intensity and the waveform feature quantity of radio waves.

The clustering part 202 is configured to carry out clustering of waveform feature quantity of radio waves for each wireless communication device 900 serving as a transmission source of wireless signals using the history information stored on the storage unit 201 upon adopting the likelihood including the correlation coefficient of time-series waveform feature quantity of radio waves received at different positions.

The wireless communication identification device 1 may reflect reception positions and reception times to receive radio waves in clustering using the time-series feature quantity of radio waves received at different positions. Accordingly, it is expected to carry out highly-accurate clustering with the wireless communication identification device 1. In addition, it is possible for the wireless communication identification device 1 to obtain a set of waveform feature quantity of radio waves subjected to accurate clustering for each wireless communication device 900 serving as a transmission source of wireless signals. Despite the coexistence of two wireless communication devices 900 having very similar waveform feature quantity of radio waves, it is possible for the wireless communication identification device 1 to identify each of wireless communication devices 900 using the correlation coefficient of the time-series waveform feature quantity of radio waves based on differences of variations of radio-field intensity due to different movements of the wireless communication devices 900.

The clustering part 202 may carry out clustering to increase an absolute correlation value of time-series feature quantity of wireless signals which are subjected to clustering with the same wireless communication device 900 but received at different positions. Due to a relatively large absolute correlation value of time-series feature quantity of wireless signals subjected to clustering with the same wireless communication device 900, it is possible to appropriately set parameters to clustering implemented by the clustering part 202. For this reason, it is expected that the clustering part 202 can carry out clustering with high accuracy.

The sensor unit 10 includes the A/D converter 101 for converting analog received signals into digital signals, the waveform-feature-quantity extraction part 102 for extracting waveform feature quantity of radio waves from digital signals, and the power measurement part 103 for measuring radio-field intensity from digital signals. Accordingly, it is possible for the wireless communication identification device 1 to identity the wireless communication device 900 using waveform feature quantity for each radio wave.

Using a plurality of sensor units 10 provided in association with a plurality of positions to acquire radio waves, it is possible for the wireless communication identification device 1 to concurrently receive and process a plurality of wireless signals from a plurality of wireless communication devices 900. In addition, it is possible for the wireless communication identification device 1 to cover a relatively large space to receive radio waves according to the allocation of multiple sensor units 10.

Second Exemplary Embodiment

Figure 3:
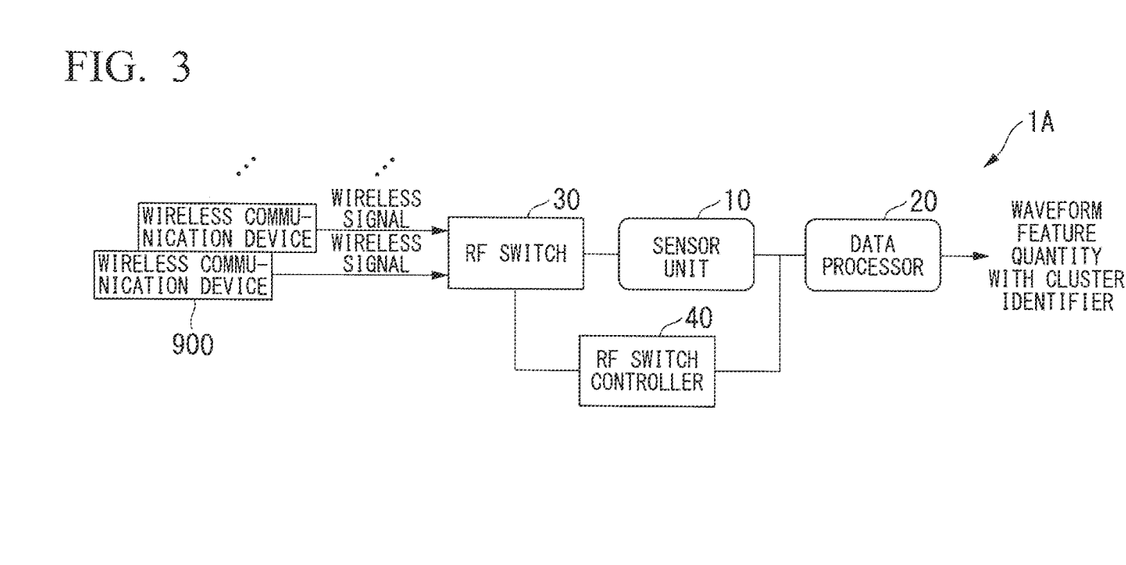
FIG. 3 is a block diagram showing a configuration example of a wireless communication identification device according to the second exemplary embodiment of the present invention.

Next, a wireless communication identification device according to the second exemplary embodiment of the present invention will be described below. FIG. 3 is a block diagram showing a configuration example of a wireless communication identification device 1A according to the second exemplary embodiment of the present invention. The wireless communication identification device 1A includes the sensor unit 10, the data processor 20, an RF switch 30, and an RF switch controller 40. In this connection, "RF" represents "Radio Frequency". A plurality of wireless communication devices 900 may emit a plurality of wireless signals which are obtained at different positions and input to the RF switch 30. The RF switch controller 40 is configured to control switching of the RF switch 30.

Under the control of the RF switch controller 40, the RF switch 30 may selectively supply to the sensor unit 10 one series of wireless signals between two series of wireless signals. As described above, the sensor unit 10 is configured to detect the wireless signal information (e.g. radio-field intensity and waveform feature quantity of radio waves) from wireless signals. In the second exemplary embodiment, the data processor 20 inputs the wireless signal information from the sensor unit 10 and the wireless-signal-acquisition-position information from the RF switch controller 40. The data processor 20 is configured to generate the waveform feature quantity of radio waves accompanied with a cluster identifier.

Under the control of the RF switch controller 40, as described above, the RF switch 30 may send one series of wireless signals to the sensor unit 10 among multiple series of wireless signals obtained at different positions. The data processor 20 may input the wireless signal information from the sensor unit 10 and the wireless-signal-acquisition-position information from the RF switch controller 40.

The second exemplary embodiment can achieve the same effect of the first exemplary embodiment. In the second exemplary embodiment which is configured to switch over and supply multiple series of wireless signals to the sensor unit 10 using the RF switch 30 and the RF switch controller 40, it is possible to reduce the number of sensor units 10 to be smaller than that of the first exemplary embodiment. Accordingly, it is possible to reduce the cost borne by the sensor unit(s) 10.

Third Exemplary Embodiment

Figure 4:
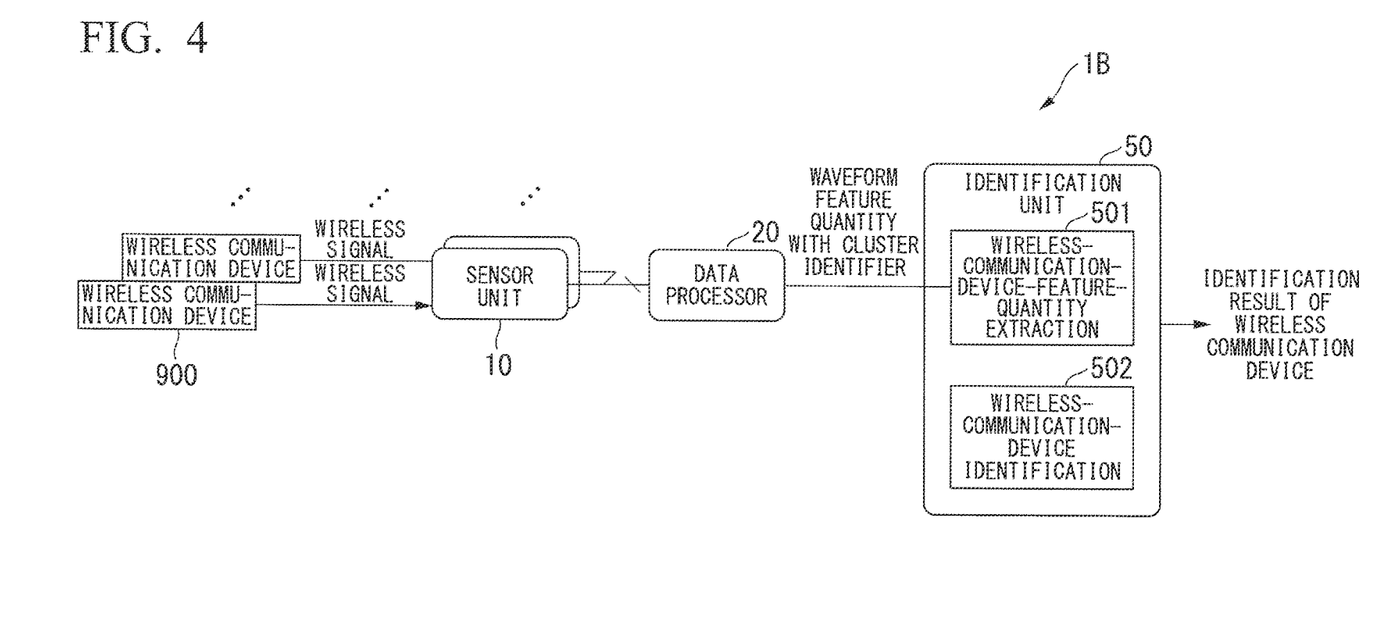
FIG. 4 is a block diagram showing a configuration example of a wireless communication identification device according to the third exemplary embodiment of the present invention.

Next, a wireless communication identification device according to the third exemplary embodiment of the present invention will be described below. FIG. 4 is a block diagram showing a configuration example of a wireless communication identification device 1B according to the third exemplary embodiment of the present invention. The wireless communication identification device 1B includes a plurality of sensor units 10, the data processor 20, and an identification unit 50. The identification unit 50 includes a wireless-communication-device-feature-quantity extraction part 501 and a wireless-communication-device identification part 502.

A plurality of sensor units 10 are configured to receive a plurality of wireless signals from a plurality of wireless communication devices 900. The sensor unit 10 is configured to detect radio-field intensity and waveform feature quantity of radio waves in wireless communications, thus sending detection results to the data processor 20. The data processor 20 applies a cluster identifier to the waveform feature quantity of radio waves so as to send it to the identification unit 50. The identification unit 50 outputs an identification result of identifying the wireless communication device 900 serving as a transmission source of wireless signals received by the sensor unit 10.

In the third exemplary embodiment shown in FIG. 4, the sensor units 10 and the data processor 20 are identical to those of the first exemplary embodiment shown in FIG. 1. In FIG. 4, it is possible to replace the configuration of the sensor units 10 with the corresponding configuration of the third exemplary embodiment shown in FIG. 3. Specifically, it is possible to replace a plurality of sensor units 10 with a combination of the RF switch 30, the RF switch controller 40, and the sensor unit 10 shown in FIG. 3.

Figure 5:
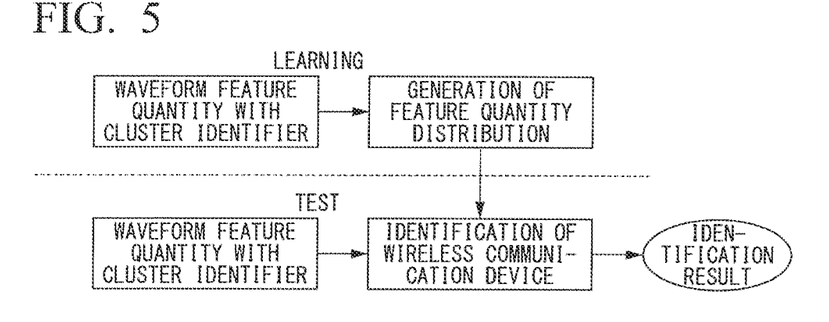
FIG. 5 is a block diagram showing a procedure of an identification part of the wireless communication identification device according to the third exemplary embodiment of the present invention.

FIG. 5 is a block diagram showing a procedure of the identification unit 50. The procedure of the identification unit 50 is divided into a learning phase and a test phase. The learning phase is used to learn the waveform feature quantity of radio waves emitted from the wireless communication device 900. That is, the wireless-communication-device-feature-quantity extraction part 501 may learn the waveform feature quantity accompanied with a cluster identifier, which is supplied from the data processor 20, thus generating a distribution model of waveform feature quantity for each cluster. In the test phase, the wireless-communication-device identification part 502 may identify the wireless communication device 900 using the distribution model of waveform feature quantity which is generated in the learning phase. That is, the wireless-communication-device identification part 502 is configured to compare the waveform feature quantity with a cluster identifier supplied from the data processor 20 with the distribution model of waveform feature quantity for each cluster obtained in the learning phase. The wireless-communication-device identification part 502 is configured to output the cluster identifier of the wireless communication device 900 associated with a cluster having the distribution model given the highest degree of coincidence on comparison.

As described above, the identification unit 50 may input the waveform feature quantity with a cluster identifier from the data processor 20. In the identification unit 50, the wireless-communication-device-feature-quantity extraction part 501 is configured to generate a distribution model of waveform feature quantity for each cluster by the learning process. The wireless-communication-device identification part 502 applies the waveform feature quantity supplied from the data processor 20 to the distribution model of waveform feature quantity for each cluster so as to identify the wireless communication device 900.

The wireless communication identification device 1B of the third exemplary embodiment is configured to identify the wireless communication device 900 by executing the learning process using the waveform feature quantity subjected to clustering with high accuracy, and therefore it is possible to obtain an effect of identifying the wireless communication device 900 with high accuracy in addition to the foregoing effect produced by the first exemplary embodiment.

Fourth Exemplary Embodiment

Figure 6:
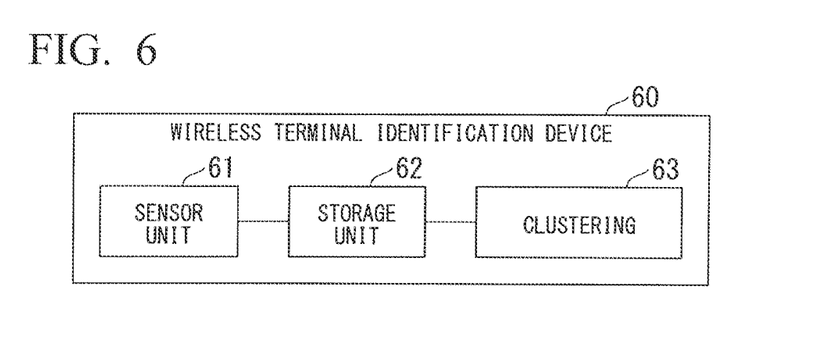
FIG. 6 is a block diagram showing a configuration example of a wireless communication identification device according to the fourth exemplary embodiment of the present invention.

Next, a wireless communication identification device (or a wireless terminal identification device) according to the fourth exemplary embodiment of the present invention will be described below. FIG. 6 is a block diagram showing a configuration example of a wireless terminal identification device 60 according to the fourth exemplary embodiment of the present invention. The wireless terminal identification device 60 includes a sensor unit 61, a storage unit 62, and a clustering part 63. The sensor unit 61 is configured to detect radio-field intensity and radio-waveform-feature quantity upon receiving a plurality of wireless signals at a plurality of positions. The storage unit 62 is configured to store the radio-field intensity and the radio-waveform-feature quantity as the history information. The clustering part 63 is configured to apply the likelihood function, which includes the correlation coefficient of time-series waveform feature quantity of radio waves received at different positions, to the history information stored on the storage unit 62, thus carrying out clustering of radio-waveform-feature quantity for each wireless communication device 900 serving as a transmission source of wireless signals.

In the wireless terminal identification device 60, reception positions and reception times to receive radio waves are reflected in clustering using time-series waveform feature quantity of radio waves received at different positions. Accordingly, it is expected that the wireless terminal identification device 60 can carry out clustering with high accuracy. That is, it is possible for the wireless terminal identification device 60 to obtain a set of waveform feature quantity of wireless signals which are subjected to highly-accurate clustering for each wireless communication device 900 serving as a transmission source of radio waves.

The entirety or part of functions implemented by the wireless communication identification devices 1 according to the foregoing exemplary embodiments can be realized using hardware, software, or combinations of hardware and software. When realizing the functions of the foregoing exemplary embodiments using software, it is necessary to load programs to a computer and to thereby execute programs by the computer. When realizing the configurations of the foregoing exemplary embodiments using hardware, for example, the entirety or part of the configuration of the wireless communication identification device 1 should be configured using integrated circuits such as LST (Large Scale Integration), ASIC (Application-Specified Integrated Circuitry), gate arrays, and FPGA (Field Programmable Gate Array).

Specifically, when realizing the functions of the foregoing exemplary embodiments using software, it is necessary to provide a computer serving as the wireless communication identification device 1 with a storage unit such as hard disks or ROM for storing programs, a display unit such as a liquid-crystal display, DRAM for storing data necessary to carry out operations, and CPU, wherein those configuration parts are connected together through buses. For example, the entirety or part of the operation of the data processor 20 may be expressed by programs to be stored on a storage unit such as ROM, wherein data necessary to carry out operations may be stored on DRAM, and thereby CPU is used to execute programs. As described above, it is possible to realize the function of the data processor 20 by executing programs.

The foregoing programs may be stored on various types of non-transitory storage media (e.g. a non-transitory computer-readable storage medium and a tangible storage medium) and loaded to computers. As non-transitory storage media, it is possible to mention magnetic storage media (e.g. flexible disks, magnetic tapes, hard-disk drives), magneto-optical storage media (e.g. magneto-optical disks), CD-ROM, CD-R, CD-R/W, and semiconductor memory (e.g. mask ROM, PROM (Programmable ROM), EPROM (Erasible PROM), flash ROM, RAM). In addition, it is possible to load programs into computers using various types of non-transitory storage media (e.g. a transitory computer-readable storage medium). In this connection, transitory storage media may be any media for transmitting electric signals, optical signals, and electromagnetic waves. Accordingly, it is possible to deliver programs to computers through transitory storage media such as wired communication paths such as communication lines and optical fibers or wireless communication paths.

Lastly, the present invention is not necessarily limited to the foregoing exemplary embodiments; hence, the present invention may include various modifications and design changes within the scope of the invention as defined by the appended claims without departing from the essence of the invention.

The present application claims the benefit of priority on Japanese Patent Application No. 2018-99178 filed on May 23, 2018, the subject matter of which is hereby incorporated herein by reference.

INDUSTRIAL APPLICABILITY

The present invention is designed to carry out clustering by reflecting reception places and reception times to receive radio waves to radio-field intensity and waveform feature quantity of radio waves extracted from wireless signals from a plurality of wireless communication devices, but it is possible to carry out clustering upon detecting waveform feature quantity of radio waves from other radio generation devices (or radio emission sources) than wireless communication devices. In addition, it is possible to identify a radio generation source upon receiving a plurality of radio waves.

REFERENCE SIGNS LIST 1 wireless communication identification device
10 sensor unit
20 data processor
30 RF switch
40 RF switch controller
50 identification unit
60 wireless terminal identification device
61 sensor unit
62 clustering part
101 A/D converter
102 waveform-feature-quantity extraction part
103 power measurement part
201 storage unit
202 clustering part
501 wireless-communication-device-feature-quantity extraction part
502 wireless-communication-device identification part

The invention claimed is:

1. A wireless communication identification device comprising:
a sensor unit configured to receive wireless signals from a plurality of wireless communication devices at a plurality of positions and to thereby detect radio-waveform feature quantity and radio-field intensity;
a storage unit configured to store the radio-waveform feature quantity and the radio-field intensity as history information; and
a clustering part configured to apply a likelihood function including a correlation coefficient of time-series radio-waveform feature quantity of the wireless signals received at the plurality of positions to the history information and to thereby carry out clustering of the radio-waveform feature quantity for each wireless communication device serving as a transmission source of the wireless signals.

2. The wireless communication identification device according to claim 1, wherein the clustering part is configured to carry out clustering to increase correlation of the time-series radio-waveform feature quantity of the wireless signals which are received at different positions and subjected to clustering with a same wireless communication device.

3. The wireless communication identification device according to claim 1, wherein the sensor unit comprises an A/D converter configured to convert the wireless signals from each wireless communication device from analog signals to digital signals,
a waveform-feature-quantity extraction part configured to extract the radio-waveform feature quantity from the digital signals, and
a power measurement part configured to measure the radio-field intensity from the digital signals.

4. The wireless communication identification device according to claim 1, wherein a plurality of sensor units are disposed at a plurality of radio-acquisition positions corresponding to the plurality of wireless communication devices.

5. The wireless communication identification device according to claim 1, further comprising an RF switch disposed at a foreside of the sensor unit and an RF switch controller configured to control the RF switch, wherein under the control of the RF switch, the RF switch is configured to switch over multiple series of wireless signals obtained at different positions and to thereby supply single series of wireless signals to the sensor unit, wherein the sensor unit is configured to detect from the single series of wireless signals the radio-waveform feature quantity and the radio-field intensity which are supplied to the storage unit, and wherein the RF switch controller is configured to supply an acquisition position to acquire the single series of wireless signals to the storage unit.

6. The wireless communication identification device according to claim 1, further comprising an identification unit configured to input waveform feature quantity with a cluster identifier as the radio-waveform feature quantity from the clustering part, and wherein the identification part is configured to identify each wireless communication device serving as the transmission source of the wireless signals based on the waveform feature quantity with the cluster identifier.

7. The wireless communication identification device according to claim 6, wherein the identification unit comprises a wireless-communication-device-feature-quantity extraction part configured to generate a distribution model of the radio-waveform feature quantity for each cluster, and a wireless-communication-device identification part configured to identify each wireless communication device by applying the waveform feature quantity with the cluster identifier to the distribution model of the radio-waveform feature quantity.

8. A wireless communication identification method comprising:
a process configured to receive wireless signals from a plurality of wireless communication devices at a plurality of positions and to thereby detect radio-waveform feature quantity and radio-field intensity;
a process configured to store the radio-waveform feature quantity and the radio-field intensity as history information; and
a process configured to apply a likelihood function including a correlation coefficient of time-series radio-waveform feature quantity of the wireless signals received at the plurality of positions to the history information and to thereby carry out clustering of the radio-waveform feature quantity for each wireless communication device serving as a transmission source of the wireless signals.

9. A non-transitory computer-readable storage medium configured to store a program causing a computer to implement:
 a process configured to receive wireless signals from a plurality of wireless communication devices at a plurality of positions and to thereby detect radio-waveform feature quantity and radio-field intensity;
 a process configured to store the radio-waveform feature quantity and the radio-field intensity as history information; and
 a process configured to apply a likelihood function including a correlation coefficient of time-series radio-waveform feature quantity of the wireless signals received at the plurality of positions to the history information and to thereby carry out clustering of the radio-waveform feature quantity for each wireless communication device serving as a transmission source of the wireless signals.

\* \* \* \* \*